US012633432B2

(12) United States Patent
Przybysz et al.

(10) Patent No.: US 12,633,432 B2
(45) Date of Patent: May 19, 2026

(54) ACTIVE MOAT SYSTEM FOR FLUX TRAPPING

(71) Applicants: Anthony Joseph Przybysz, Linthicum, MD (US); Aurelius L. Graninger, Sykesville, MD (US); Aaron Christopher Lee, Hyattsville, MD (US)

(72) Inventors: Anthony Joseph Przybysz, Linthicum, MD (US); Aurelius L. Graninger, Sykesville, MD (US); Aaron Christopher Lee, Hyattsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 886 days.

(21) Appl. No.: 17/844,880

(22) Filed: Jun. 21, 2022

(65) Prior Publication Data

US 2023/0411046 A1 Dec. 21, 2023

(51) Int. Cl.
| | |
|---|---|
| *H01B 12/06* | (2006.01) |
| *H01B 12/16* | (2006.01) |
| *H10N 69/00* | (2026.01) |

(52) U.S. Cl.
CPC ............. *H01B 12/06* (2013.01); *H01B 12/16* (2013.01); *H10N 69/00* (2023.02)

(58) Field of Classification Search
CPC ........ H01B 12/06; H01B 12/16; H10N 69/00; H10N 60/30; H10N 60/84
See application file for complete search history.

(56) References Cited

U.S. PATENT DOCUMENTS

| | | | | |
|---|---|---|---|---|
| 4,869,598 A | * | 9/1989 | McDonald | ............. H10N 60/84 |
| | | | | 374/176 |
| 9,466,643 B2 | | 10/2016 | Herr et al. | |

(Continued)

FOREIGN PATENT DOCUMENTS

| | | | | | |
|---|---|---|---|---|---|
| CN | 107924744 A | * | 4/2018 | ............. | H10N 60/84 |
| JP | 2022509003 A | * | 1/2022 | ............... | H01F 6/06 |

(Continued)

OTHER PUBLICATIONS

Fujiwara, et al.: "Research on Effective Moat Configuration for Nb Multi-Layer Device Structure"; IEEE Transactions on Applied Superconductivity, vol. 19, No. 3, Jun. 2009 pp. 603-606.

(Continued)

*Primary Examiner* — Ratisha Mehta
*Assistant Examiner* — Thaddeus J Kolb
(74) *Attorney, Agent, or Firm* — Tarolli, Sundheim, Covell & Tummino LLP

(57) ABSTRACT

A superconductor system is provided that includes a superconductor device comprising a plurality of superconductor layers and dielectric layers interleaved with the plurality of superconductor layers, wherein at least one superconductor layer is a ground plane. The superconductor device further includes superconductor circuitry that resides within one or more of the plurality of superconductor layers, and one or more active moats extending through the plurality of superconductor layers and the dielectric layers, wherein at least one flux vortex caused by cryogenic cooling can be removed from at least one of the plurality of superconductor layers into the one or more active moats by the activating and deactivating of the one or more active moats.

16 Claims, 7 Drawing Sheets

(56)  References Cited

U.S. PATENT DOCUMENTS

| | | | | |
|---|---|---|---|---|
| 10,700,621 | B2 | 6/2020 | Adams | |
| 2015/0187840 | A1* | 7/2015 | Ladizinsky | H10N 60/805 |
| | | | | 257/31 |
| 2016/0071903 | A1* | 3/2016 | Herr | H10N 69/00 |
| | | | | 505/170 |
| 2017/0236627 | A1* | 8/2017 | Walsh | H02K 1/12 |
| | | | | 62/51.1 |
| 2018/0205328 | A1* | 7/2018 | Adams | H02N 11/002 |
| 2020/0287118 | A1* | 9/2020 | Herr | H10N 60/83 |
| 2021/0217949 | A1* | 7/2021 | Kirby | H01L 23/53242 |
| 2022/0343049 | A1* | 10/2022 | Accisano | G06F 30/327 |
| 2023/0200260 | A1* | 6/2023 | Gibson | H10N 60/805 |
| | | | | 257/31 |

FOREIGN PATENT DOCUMENTS

| | | | | | |
|---|---|---|---|---|---|
| WO | WO-2019036209 | A1 | * | 2/2019 | H01L 23/66 |
| WO | WO-2021113513 | A1 | * | 6/2021 | G06N 10/40 |

OTHER PUBLICATIONS

Polyakov, et al.: "Flux Trapping in Superconducting Circuits"; IEEE Transactions on Applied Superconductivity, vol. 17, No. 2, Jun. 2007; pp. 520-525.

WOISR (Written Opinion and International Search Report) for corresponding PCT/US2023/023180 mailed Dec. 3, 2024.

* cited by examiner

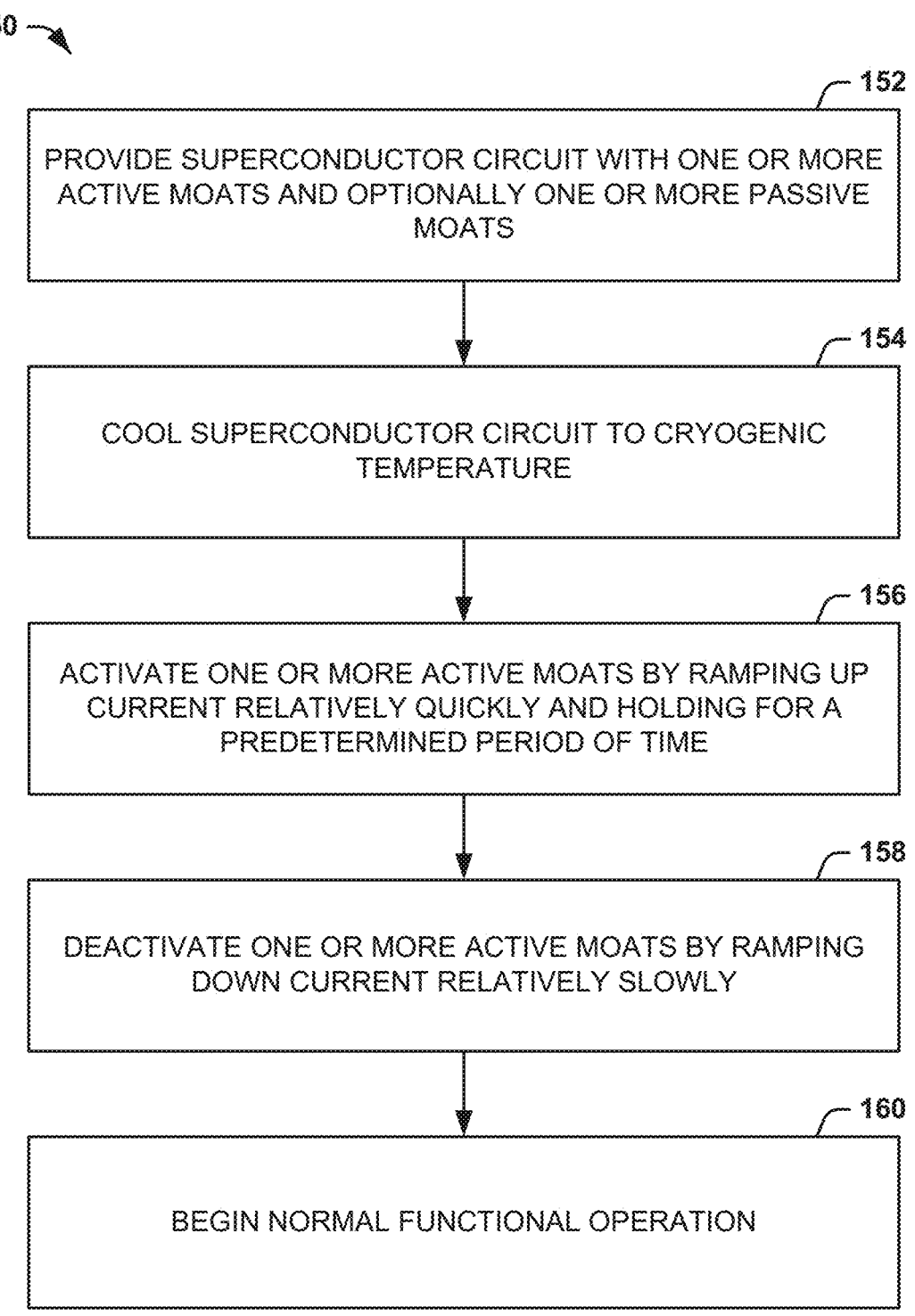

150

152

PROVIDE SUPERCONDUCTOR CIRCUIT WITH ONE OR MORE ACTIVE MOATS AND OPTIONALLY ONE OR MORE PASSIVE MOATS

154

COOL SUPERCONDUCTOR CIRCUIT TO CRYOGENIC TEMPERATURE

156

ACTIVATE ONE OR MORE ACTIVE MOATS BY RAMPING UP CURRENT RELATIVELY QUICKLY AND HOLDING FOR A PREDETERMINED PERIOD OF TIME

158

DEACTIVATE ONE OR MORE ACTIVE MOATS BY RAMPING DOWN CURRENT RELATIVELY SLOWLY

160

BEGIN NORMAL FUNCTIONAL OPERATION

FIG. 10

ACTIVE MOAT SYSTEM FOR FLUX TRAPPING

GOVERNMENT INTEREST

The invention was made under Government Contract. Therefore, the US Government has rights to the invention as specified in that contract.

TECHNICAL FIELD

The present invention relates generally to superconducting circuits, and more particularly to an active moat system for flux trapping.

BACKGROUND

Superconductor electronics is a unique technology that delivers fast digital circuits with extremely low power dissipation. However, superconductor electronics is still an emerging technology and as a result there are still a variety of technical problems that remain to be solved, many of which are found in other microelectronic integrated circuit technologies. However, two groups of problems are unique to superconductor electronics. One of them is associated with the necessity of cooling down superconductor circuits to very low cryogenic temperatures. The second group of unique problems is associated with magnetic flux trapping. Flux trapping is affected by the background magnetic environment during the cooling and operation of superconducting integrated circuits. It is widely accepted that flux trapping is one of the most serious problems that could create an integration limit for superconductor circuits.

The presence of parasitic magnetic field lines during cooling and operation severely limits the yield and performance of many superconducting circuits. The majority of circuits employed in various superconductor electronics applications are composed of closed loops of superconducting wire that may be interrupted by one or more Josephson junctions, i.e. a superconducting quantum interference device (SQUID). While the Meissner effect precludes the trapping of magnetic flux lines within the interior of defect-free superconducting films, magnetic flux lines are readily trapped within such loops and SQUIDs. The cooling of a superconducting loop from above its superconducting critical temperature to below it while enclosing magnetic flux may result in a persistent current that flows in the loop that is proportional to the inductance of the loop and the amount of enclosed flux. Such a circulating current can degrade the performance of the circuit containing the loop. It can also degrade the performance of adjoining circuits that have a non-negligible inductive coupling.

Flux quantization dictates that superconducting loops enclose flux in integer multiples of the magnetic flux quantum $\Phi_0 = 2.07 \times 10^{-15}$ Wb. One magnetic flux vortex corresponds to $\Phi_0$, two flux vortices correspond to $2\Phi_0$, etc. Superconducting loops may enclose more than one flux vortex. The amount of magnetic flux vortices trapped in a given loop comprising a superconducting integrated circuit is difficult to predict and characterize and depends in part on the profile of the background magnetic field, rate of cooling, and the potential energy profile of the circuit which depends on the precise layout of the integrated circuit. Due to the impact on circuit performance of flux trapping and the difficulty in knowing a priori where flux will tend to reside, superconducting integrated circuit designs routinely employ moat (opening) structures which are located in non-active parts of the circuit and which provide preferential flux trapping sites that will not degrade circuit performance. These passive moats can take up to 15-20% or more of the area of the superconducting circuit, and also require extensive modeling and experimental iteration to determine the optimal size and configuration.

SUMMARY

In one example, a superconductor system is provided that includes a superconductor device comprising a plurality of superconductor layers and dielectric layers interleaved with the plurality of superconductor layers, wherein at least one superconductor layer is a ground plane. The superconductor device further includes superconductor circuitry that resides within one or more of the plurality of superconductor layers, and one or more active moats extending through the plurality of superconductor layers and the dielectric layers, wherein at least one flux vortex caused by cryogenic cooling can be removed from at least one of the plurality of superconductor layers into the one or more active moats by the activating and deactivating of the one or more active moats.

In another example, a superconductor device is provided that comprises a plurality of superconductor layers and dielectric layers interleaved with the plurality of superconductor layers, wherein at least one superconductor layer is a ground plane. The superconductor device further comprises superconductor circuitry that resides within one or more of the plurality of superconductor layers, and an active moat extending through the plurality of superconductor layers and the dielectric layers. The active moat comprises a heating element and an opening that extends through the plurality of superconductor layers and the dielectric layers, wherein at least one flux vortex caused by cryogenic cooling can be removed from at least one of the plurality of superconductor layers into the active moat by the activating of the active moat causing a surrounding region to heat and become normal and deactivating of the active moat to cause the pulling of the at least one vortex into the opening in the active moat.

In yet another example, a method is provided for preparing a superconductor device for operation. The method comprises providing a superconductor device with one or more active moats, the superconductor device including a plurality of superconductor layers and dielectric layers interleaved with the plurality of superconductor layers, wherein at least one superconductor layer is a ground plane. The method further comprises cooling the superconductor device to cryogenic temperature at or below the critical temperature of the superconductor material used to form operational superconductor circuitry in the superconductor device, and activating the one or more active moats to cause heated normal regions around the one or more active moats, wherein the active moats comprise a heating element disposed in an opening that extends through a plurality of superconductor layers and dielectric layers. The method also comprises deactivating the one or more active moats to pull vortices formed on at least one of the plurality of superconductor layers caused by cryogenic cooling into the active moats from the heated normal regions.

BRIEF DESCRIPTION OF THE DRAWINGS

FIG. 10 illustrates an example of a methodology for preparing a superconductor device for operation.

DETAILED DESCRIPTION

Figure 1:
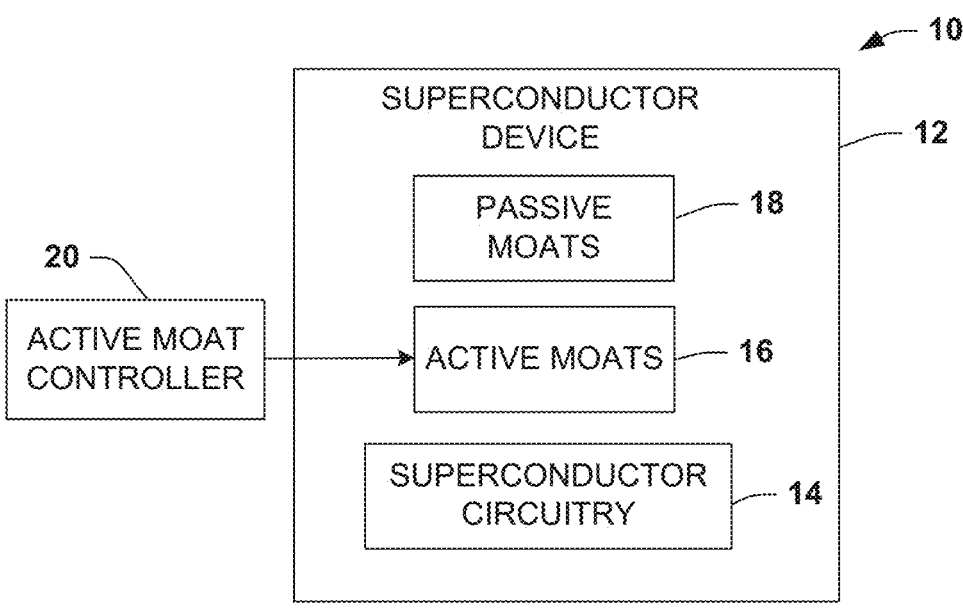
FIG. 1 illustrates a block diagram of an example superconductor system that employs an active moat system.

The present disclosure relates generally to superconducting circuits, and more particularly to an active moat system for flux trapping in an integrated circuit ("chip" or "device"). The system includes an on-chip structure consisting of one or more active moats. An active moat can be formed of a heating (e.g., resistive) element disposed in a moat opening in a plurality of superconducting layers and interleaving dielectrics layers of a superconducting device, wherein at least one of the superconductor layers is a ground plane. A controller can be configured to apply current to the heating element elevating the local temperature of the chip, such that the superconducting films near and around the heating element become normal. A plurality of active moats can be spaced about the integrated circuit to cover a substantial portion of the integrated circuit area. A combination of current and time can be used to control the size of a given heat region around a given active moat. If there are flux vortices pinned in the superconductor film(s) after cryogenic cooling, then they will be freed as the film around them becomes normal. Then the current applied to the heating element can be decreased slowly such that all vortices are gradually focused into the active moat openings in which the heating element resides.

The problem with using a regular array of passive moats (e.g., each having an area of 2×2 micrometers) is that the moats need to be relatively closely spaced (e.g., every 10 micrometers) in order for them to be effective at sequestering flux. This is because the ground plane can have defects that present energetically favorable pinning site for vortices, so the moats have to be closely spaced to make sure they are the most favorable spot for trapping flux. Moats occupy valuable chip area and limit active circuit density. A moat extends through a plurality of superconductor layers and interleaving dielectric layers, wherein one of the superconductor layers is a ground plane. Flux vortices cause stray magnetic lines to bend through the superconductor device and affect the functionality of superconductor circuitry. The moat forms a set of concentric metal perimeters about the opening in each superconductor layer that controls the stray flux lines to stay within the moat once the vortex is pulled into the moat.

The active moat system would allow for the trapping potential of a single moat to be expanded relatively far in a controllable manner and then shrunk to focus vortices into the moat. The active moats can be spaced about and cover an area such as 100 micrometers×100 micrometers compared to a typical spacing of passive moats of every 10 micrometers. A relatively sparse array of active moats (e.g., 100 active moats) could achieve the same or better effect than an array of densely packed passive moats (e.g., 10,000 moats), such that 1 active moat can cover an area of 100 passive moats. This would leave more chip area available for active circuitry. The system would also allow for vortices to be dislodged on the chip without warming the entire cryostat, as is done in some superconducting systems.

In another example, the system can include a plurality of passive moats distributed about one or more active moats. As appreciated, the heating elements, such as resistors, inside the active moats consume power. A combination of using active moats and passive moats allows for a reduced power configuration with respect to an all active moat configuration, and a reduced passive moat configuration that takes up space on the device compared to an all passive moat configuration. In another example, an active moat is disposed in a superconducting device and a methodology is performed of ramping current relatively quickly through the active moat and back down relatively slower in accordance with a current profile to first dislodge vortices and then usher them into the active moat, well away from sensitive circuitry.

FIG. 1 illustrates a block diagram of an example superconductor system 10 that employs an active moat system. The superconductor system 10 includes a superconductor device 12 with one or more active moats 16 controlled by an active moat controller 20. The superconductor device 12 can be an integrated circuit device and include a superconductor circuitry 14 such as superconducting gates, SQUIDs, RQL circuits, transmission lines and other superconductor devices. The superconductor device 12 is fabricated from a plurality of superconductor layers and interleaving dielectric layers where at least one of the plurality of superconductor layers is a ground plane. The superconductor device 12 includes one or more active moats 16 and optionally, a plurality of passive moat 18 distributed across the superconductor device. The active moat controller 20 can be disposed on the integrated circuit or remote of the integrated circuit (i.e., off-chip). The active moats 16 and the optional passive moats 18 pass through the plurality of superconductor layers and dielectric layers including the ground plane. The active moats 16 include a heating element, such as a resistor disposed in an opening in the plurality of superconductor layers and dielectric layers, while the passive moats just include an opening in the plurality of superconductor layers and dielectric layers.

Figure 2:
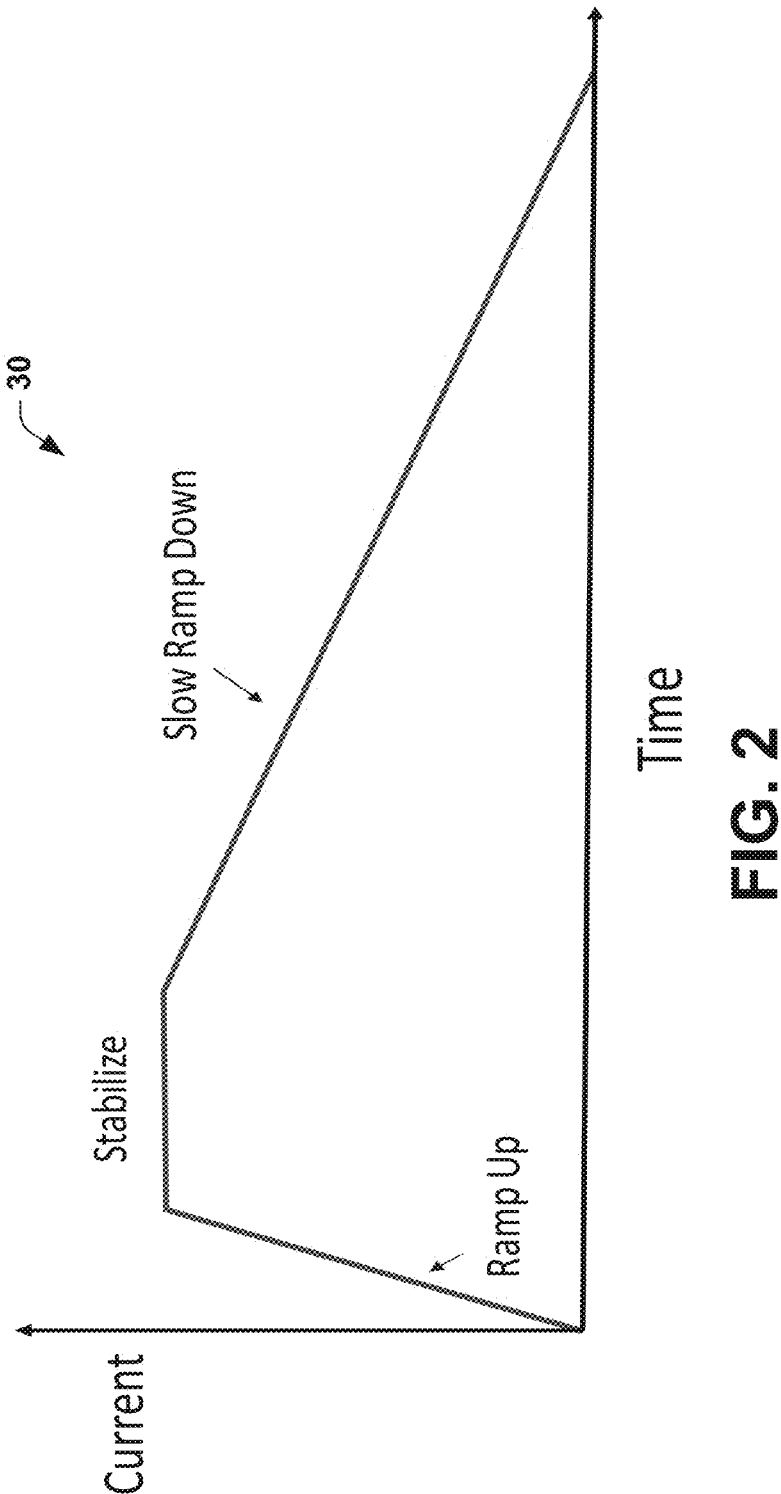
FIG. 2 illustrates an example of a current profile for providing current to a given resistor of a given active moat.

The active moat controller 20 controls the current flowing to the resistors in the active moats 16. The active controller 20 is shown as residing off-chip from the superconductor device 12. However, the active moat controller 20 can reside on chip 12. The active moat controller 20 is configured to generate current through a given resistor of a given moat for a plurality of active moats in the example of FIG. 1. FIG. 2 illustrates an example of a current profile 30 for providing current to a given resistor of a given moat. A single profile can be used for each of a plurality of active moats. Alternatively, custom current profiles can be employed for different moats based on the size of an active moat's heat region, the density of the superconductor circuitry in a region, and/or sensitivity of superconductor circuitry at different regions. The example current profile 30 of FIG. 2 has a steep ramp up slope to quickly begin the heating and expansion of the heat region followed by a short stabilization period during an activation phase. A slow longer ramp down time then assures the pulling of the many vortices into the given active moat during a deactivation phase. It is appreciated that a variety of different current profiles could be employed based on a given superconductor circuit design. For example, a slow ramp up time and a fast ramp down time, or a similar ramp up time and ramp down time may be appropriate for a given application. Additionally, a current configuration profile can be executed during a single current configuration profile cycle or can be executed multiple times over a plurality of current configuration profile cycles.

FIGS. 3-7 illustrate a top plan view of an example superconductor device 40 with a top layer superconductor ground plane 42. A plurality of superconductor layers and dielectric layer reside below the superconductor ground plane 42. A resistor 48 is disposed in an opening 46 in the superconducting device 40 to form an active moat 44 and wired out to a current bias via a control line 54 and return line 56. The opening 46 extends through the ground plane 42 through one or more layers up to all of the superconductor layers and dielectric layers of the superconductor device 40. The superconductor device 40 is first cooled down to a cryogenic temperature at or below the critical temperature of the superconductor material used to form operational superconductor circuitry in the superconductor device. As current is applied to the resistor 48, it dissipates heat in a surrounding region on the superconductor device 40. That heat causes the temperature of the surrounding region of the superconductor device 40 to rise causing the superconducting metal to become normal. However, since the superconductor device 40 is being cooled by a cryostat or a cryogenic liquid in which it is immersed, it should reach an equilibrium where the temperature of the superconductor device 40 is highest at the resistor 48 and falls off radially from the resistor 48 within the surrounding region. When enough current is applied, a "normal region" should develop around the resistor 48 where the superconductor device 40 temperature is above the critical temperature Tc of the superconductor material of the superconductor layers including the ground plane 42.

A superconducting quantum interference device (SQUID) 52 is spaced apart from the active moat. The SQUID 52 is quite sensitive to nearby magnetic flux that may be trapped during the cooling of superconducting metals from room temperature through the critical temperature of the superconducting materials of the superconductor device 40. Therefore, current is applied to the resistor 48, for example, according to a current configuration profile to facilitate the removal of any pinned vortices in the superconductor device 30 caused by dropping the temperature of the superconducting material below its critical temperature.

Figure 3:
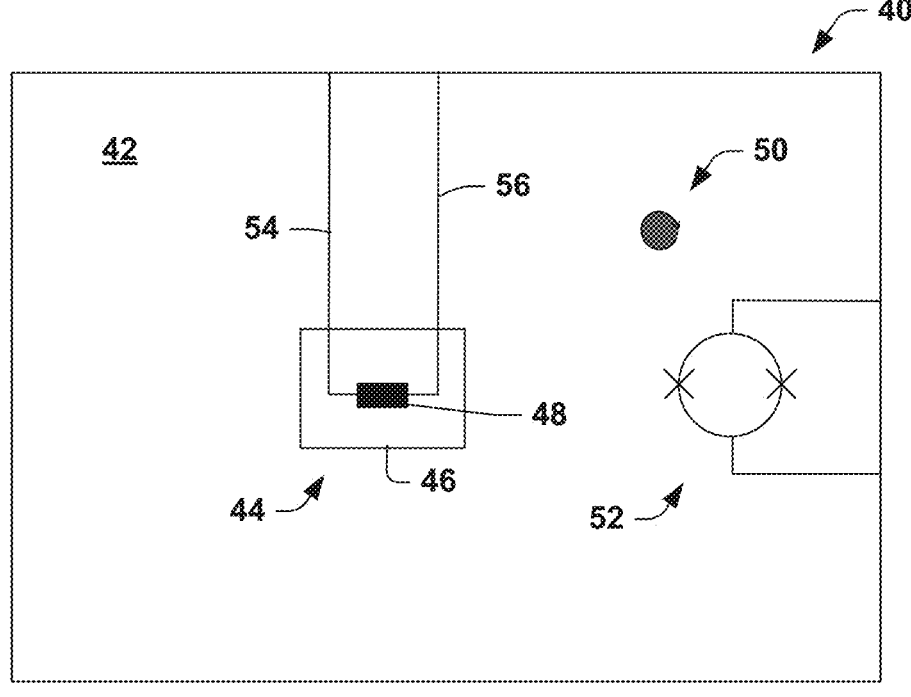
FIG. 3 illustrates a top plan view of the example superconducting device with a top layer superconductor ground plane where a flux vortex has been pinned in the superconductor device near a sensitive SQUID.
Figure 4:
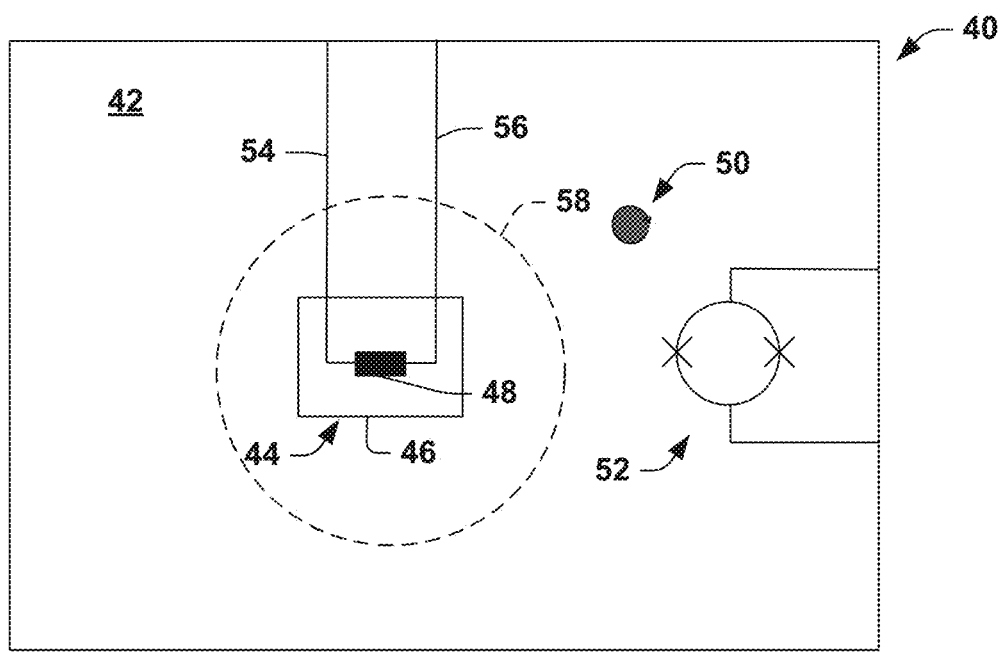
FIG. 4 illustrates a top plan view of the example superconducting device with the top layer superconductor ground plane with heat emanating from the resistor as it slowly forms a heated normal region throughout a region of the device.
Figure 5:
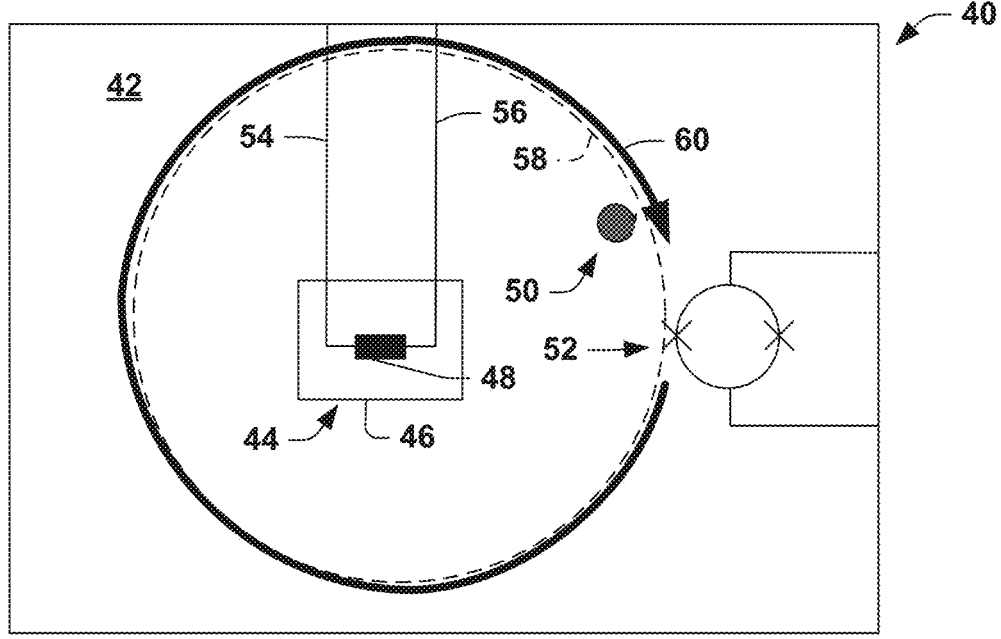
FIG. 5 illustrates a top plan view of the example superconducting device with a top layer superconductor ground plane with heat emanating from the resistor as the current applied to the resistor is increased.

FIG. 3 illustrates a top plan view of the example superconductor device 40 with the top layer superconductor ground plane 42 where a flux vortex 50 has been pinned in the superconducting device 40 near the sensitive SQUID 52. The SQUID 52 can reside in a layer below or above the top layer superconductor ground plane 42. In one example, the SQUID can reside in the ground plane 42. FIG. 4 illustrates a top plan view of the example superconductor device 40 with the top layer superconductor ground plane 42 with heat emanating from the resistor 48 as it slowly forms a heated normal region 58 over the ground plane 42 and layers below the ground plane 42 due to current being injected into the resistor 48 from control line 54 and return line 56. FIG. 5 illustrates a top plan view of the example superconductor device 40 with a top layer superconductor ground plane 42 with heat emanating from the resistor 48 as the current applied to the resistor is increased and held for a predetermined time period, which results in the heated normal region 58 spreading until it encompasses the vortex pinning site. At this point, the vortex 50 should dislodge, the flux quantum should enter the heated normal region 58, and the circulating current should spread and generate a boundary circulating current 60 around the boundary of the heated normal region 58.

Figure 6:
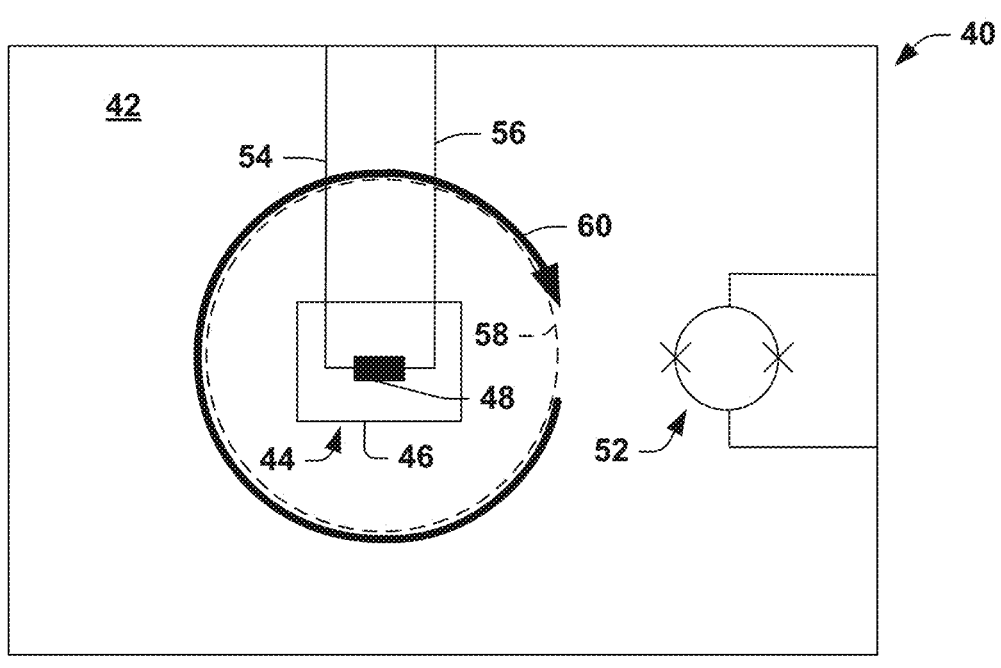
FIG. 6 illustrates a top plan view of the example superconducting device with the top layer superconductor ground plane with heat generating from the resistor as the current is reduced.
Figure 7:
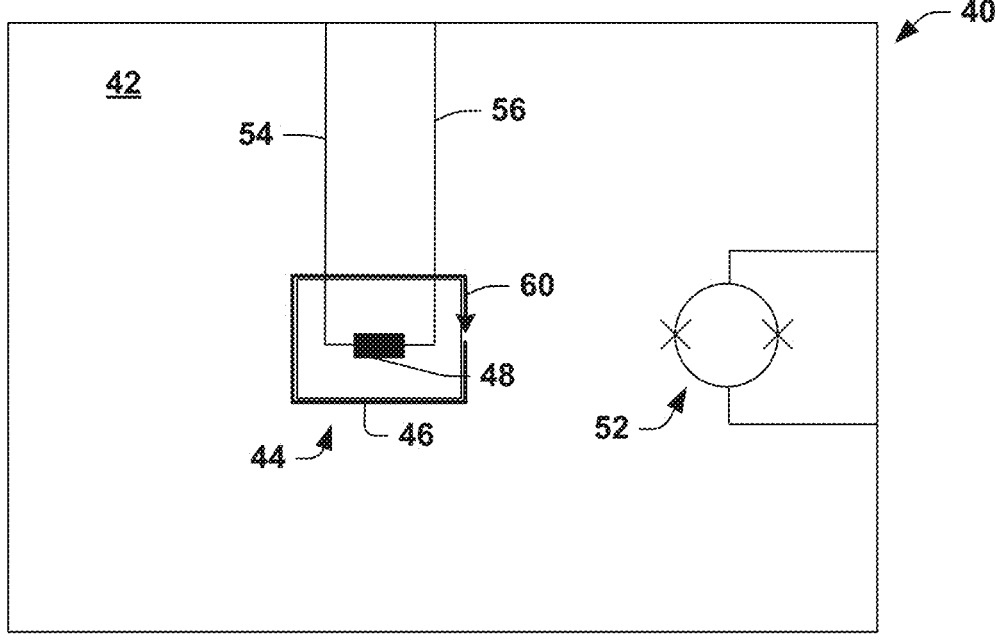
FIG. 7 illustrates a top plan view of the example superconducting device with the top layer superconductor ground plane with heat generating from the resistor as the current is brought to zero.

FIG. 6 illustrates a top plan view of the example superconductor device 40 with the top layer superconductor ground plane 42 with heat emanating from the resistor 48 as the current is reduced, and the heated normal region 58 shrinks with the flux quantum from the vortex 50 still inside the heated normal region 58. FIG. 7 illustrates a top plan view of the example superconductor device 40 with the top layer superconductor ground plane 42 with heat emanating from the resistor 48 as the current is brought to zero. The flux quantum is now inside the opening 46 in the ground plane 42 and other superconductor layers and dielectric layers and the circulating current 60 flows around the perimeters of the opening 46 in each superconductor layer. This causes the stray flux lines that result from the circulating current to be constrained within the opening 46 of the active moat 44. Since the active moat 44 is far away from the SQUID 52, the circulating current 60 from the sequestered flux should not disrupt the sensitive circuitry, such as the SQUID 52.

Figure 8:
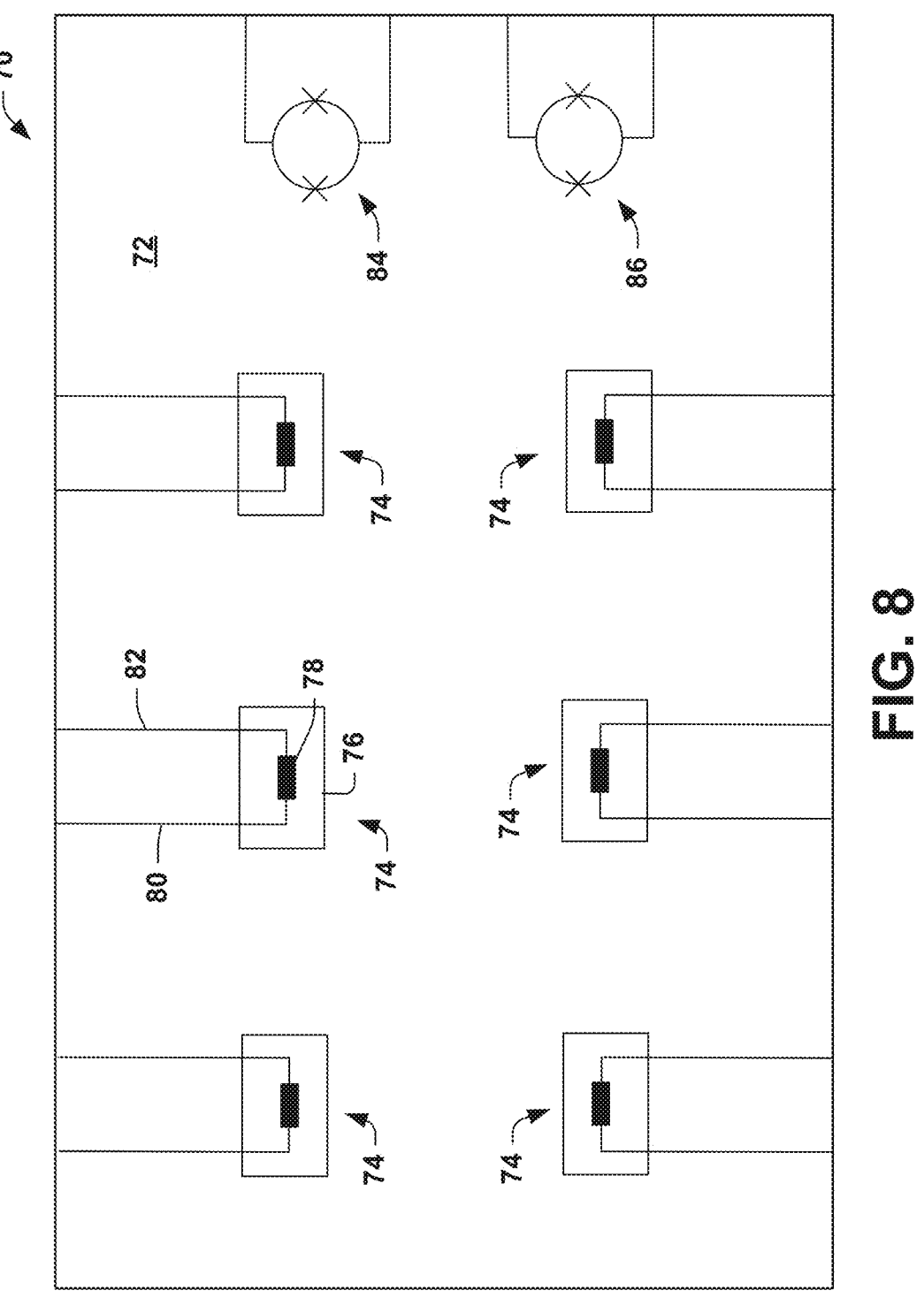
FIG. 8 illustrates a top plan view of an example superconductor device with a plurality of active moats disposed in different heat regions of the superconductor device.

The same sequence illustrated in FIGS. 3-7 can be repeated for a plurality of active moats residing on the superconductor device 40. FIG. 8 illustrates a top plan view of an example superconductor device 70 with a plurality of active moats 74 disposed in different heat regions of the superconductor device 70. Each of the plurality of active moats 74 includes a resistor 78 disposed in an opening 76 in the superconducting device 70 and wired out to a current bias via a respective control line 80 and respective return line 82. In one example, dedicated control lines and return lines are provided to each respective active moat. In another example, the same control line and return line can be employed for each of the plurality of active moats. The openings 76 extend through the ground plane 72 through one or more layers up to all of the layers of the superconductor device 70. As current is applied to each resistor 78, it dissipates heat in a respective surrounding region on the superconductor device 70. The active moats 74 are spaced apart to provide heated normal regions in different areas of the superconductor device 70 to cover a substantial portion of the integrated circuit area.

A first SQUID 84 and a second SQUID 86 are disposed on the superconductor device 70. The first and second SQUIDs can be disposed on an active layer above, below or in the ground plane 72. Although not shown, a large number and variety of other superconductor circuitry can reside within the superconductor device 70. A combination of current and time can be used to control the size of a given heat region around a given active moat. If there are flux vortices pinned in the film(s), then they will be freed as the film(s) around them becomes normal. Then the current applied to the resistors 78 can be decreased slowly such that all vortices are gradually focused into respective openings 76 of respective active moats 74 in respective regions of the superconductor device 70 removing any flux vortices that may affect the functionality of the first SQUID 84, the second SQUID 86 and other superconductor circuitry during normal operations.

Figure 9:
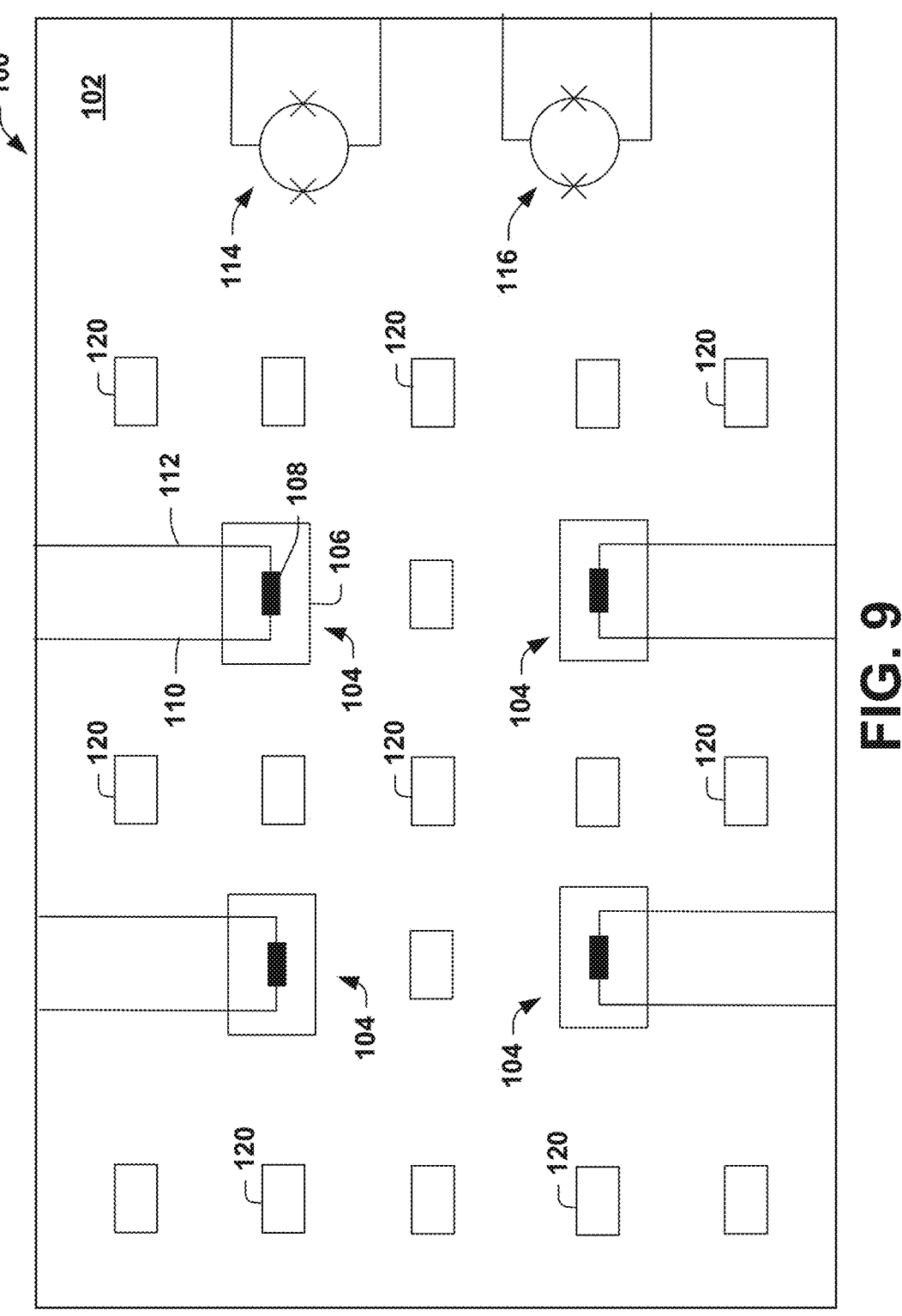
FIG. 9 illustrates a top plan view of an example superconductor device with a plurality of active moats and a plurality of passive motes disposed in different heat regions of the superconductor device.

FIG. 9 illustrates a top plan view of an example superconductor device 100 with a plurality of active moats 104 and a plurality of passive moats 120 disposed in different heat regions of the superconductor device 100. Each of the plurality of active moats 104 includes a resistor 108 disposed in an opening 106 in the superconducting device 100 and wired out to a current bias via a respective control line 110 and respective return line 112. In one example, dedicated control lines and return lines are provided to each respective active moat, while in another example, the same control line and return line can be employed for each of the plurality of active moats 104. The openings 106 extend through a ground plane 102 and through one or more layers up to all of the layers of the superconductor device 100. A plurality of passive moats 120 are arranged about each of the plurality of active moats 104. The plurality of passive moats 120 allow for the reduction on the number of active moats 104, while still assuring that flux vortices can be removed across the superconductor device 100. A first SQUID 114 and a second SQUID 116 are disposed on the superconductor device 100. The first and second SQUIDs can be disposed on an active layer above, below or in the ground plane 102. Although not shown, a large number and variety of other superconductor circuitry can reside within the superconductor device 100.

As current is applied to each resistor 108, it dissipates heat in a respective surrounding region on the superconductor device 100. The active moats 104 are spaced apart to provide heated normal regions in different areas of the superconductor device 100 to cover a substantial portion of the integrated circuit area. A combination of current and time can be used to control the size of a given heat region around a given active moat. If there are flux vortices pinned in the film(s), then they will be freed as the film(s) around them becomes normal. Then the current applied to the resistors 108 can be decreased slowly such that all vortices are gradually focused into respective passive moats 120 disposed about a given heat region. Vortices that are not trapped in passive moats are eventually pulled into respective openings 106 of respective active moats 104 in respective regions of the superconductor device 100 removing any flux vortices that may affect the functionality of the first SQUID 114 and the second SQUID and other superconductor circuitry 116 during normal operations.

In view of the foregoing structural and functional features described above, a methodology in accordance with various aspects of the present invention will be better appreciated with reference to FIG. 10. While, for purposes of simplicity of explanation, the methodology of FIG. 10 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a methodology 150 for preparing a superconductor device for operation. At 152, a superconductor device is provided with one or more active moats and optionally one or more passive moats. At 154, the superconductor device is disposed in a refrigerator system and subject to cooling down to a cryogenic temperature at or below the critical temperature of the superconductor material used to form operational superconductor circuitry in the superconductor device. The methodology then proceeds to 156. At 156, the one or more active moats are activated by, for example, ramping up current relatively quickly to the heating elements of the one or more active moats. This causes heated normal regions to form in areas around the one or more active moats. The current to the heating elements is held at a given level for a predetermined time period during the activation phase to allow for expansion of the heated region. At 158, current to the heating elements is reduced relatively slowly compared to the ramp up time to pull vortices caused by cryogenic cooling into the active moats and the optional passive moats until the current reaches zero. At 160, the superconductor device begins normal functional operations.

The above discussed active moat system has the capability of significantly reducing cost by way of minimizing test times for superconducting integrated circuits. It is common in the test of superconducting integrated circuits to subject them to numerous thermal cycles—in which the chip is cooled below the superconducting transition temperature and then warmed back up in order to adequately trap magnetic flux in the ground plane moats such that the chip is able to function. Thermal cycling can be time consuming and costly from a labor perspective, especially if the chip is mounted on a liquid helium dip probe and must be physically taken out of and then slowly re-immersed into the liquid. The active moat system eliminates the need for the entire cryogenic apparatus to be warmed up by providing a means to controllably heat up and cool down the chip in a way that can be electronically automated. Thus, the active moat system allows for an increase in test throughput and a decrease in the requirement of dedicated manual labor.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconductor system comprising:
   a superconductor device comprising:
   a plurality of superconductor layers and dielectric layers interleaved with the plurality of superconductor layers, wherein at least one superconductor layer is a ground plane;
   superconductor circuitry that resides within one or more of the plurality of superconductor layers; and
   one or more active moats extending through the plurality of superconductor layers and the dielectric layers wherein at least one flux vortex caused by cryogenic cooling can be removed from at least one of the plurality of superconductor layers into the one or more active moats by the activating and deactivating of the one or more active moats, wherein each active moat comprises a heating element.

2. The system of claim 1, wherein each heating element resides within a respective opening that extends through the plurality of superconductor layers and the dielectric layers.

3. The system of claim 2, wherein the heating element is a resistor.

4. The system of claim 3, wherein for each respective active moat of the one or more active moats further comprising a control line coupled to a first end of the resistor and a return line coupled to the other end of the resistor to provide current through the resistor to generate heat to form a heated normal region around the respective active moat.

5. The system of claim 1, further comprising an active moat controller configured to activate and deactivate the one or more active moats.

6. The system of claim 5, wherein active moat controller controls an amount of current to each active moat of the one or more active moats.

7. The system of claim 6, wherein the amount of current to each active moat of the one or more active moats is based on a current configuration profile that has a relatively steep current ramp up time and relatively slow current ramp down time to assure one or more vortices pinned on the at least one of the plurality of superconductor layers are pulled into the one or more active moats during a current configuration profile cycle.

8. The system of claim 1, wherein the one or more active moats comprises a plurality of active moats spaced apart from one another to provided heated normal regions in different areas across the superconductor device.

9. The system of claim 8, further comprising a plurality of passive moats distributed about the one or more active moats, such that wherein one or more flux vortices caused by cryogenic cooling can be removed into one or more of the plurality of passive moats by the activating and deactivating of the active moat.

10. A superconductor device comprising:
   a plurality of superconductor layers and dielectric layers interleaved with the plurality of superconductor layers, wherein at least one superconductor layer is a ground plane;

superconductor circuitry that resides within one or more of the plurality of superconductor layers; and an active moat extending through the plurality of superconductor layers and the dielectric layers, the active moat comprising a heating element and an opening that extends through the plurality of superconductor layers and the dielectric layers, wherein at least one flux vortex caused by cryogenic cooling can be removed from at least one of the plurality of superconductor layers into the active moat by the activating of the active moat causing a surrounding region to heat and become normal and deactivating of the active moat to cause the pulling of the at least one vortex into the opening in the active moat.

11. The device of claim 10, wherein the heating element is a resistor.

12. The device of claim 11, further comprising a control line coupled to a first end of the resistor and a return line coupled to the other end of the resistor to receive current through the resistor to generate heat to form a heated normal region around the active moat.

13. The device of claim 10, further comprising a plurality of passive moats distributed about the active moat, such that one or more flux vortices caused by cryogenic cooling can be removed into one or more of the plurality of passive moats by the activating and deactivating of the active moat and the plurality of active moats.

14. The device of claim 13, wherein the one or more flux vortices that are not pulled into the plurality of passive moats are pulled into the active moat.

15. The device of claim 10, further comprising a plurality of additional active moats spaced apart from one another to provided heated normal regions in different regions across the superconductor device.

16. The device of claim 15, further comprising a plurality of passive moats distributed about the active moat and the plurality of additional active moats, such that wherein one or more flux vortices caused by cryogenic cooling can be removed into one or more of the plurality of passive moats by the activating and deactivating of the active moat and the plurality of additional active moats.

* * * * *